(12) United States Patent
Kim et al.

(10) Patent No.: US 12,615,987 B2
(45) Date of Patent: Apr. 28, 2026

(54) SUBSTRATE PROCESSING APPARATUS AND SYSTEM INCLUDING THE SAME

(71) Applicant: KCTECH CO., LTD., Gyeonggi-do (KR)

(72) Inventors: Hyung Chul Kim, Gyeonggi-do (KR); You Sun Jung, Busan (KR); Dong Min Kim, Gyeonggi-do (KR)

(73) Assignee: KCTECH CO., LTD., Gyeonggi-do (KR)

( * ) Notice: Subject to any disclaimer, the term of this patent is extended or adjusted under 35 U.S.C. 154(b) by 465 days.

(21) Appl. No.: 18/131,099

(22) Filed: Apr. 5, 2023

(65) Prior Publication Data

US 2023/0402297 A1     Dec. 14, 2023

(30) Foreign Application Priority Data

| | | |
|---|---|---|
| Apr. 8, 2022 | (KR) | ......................... 10-2022-0043954 |
| Jul. 15, 2022 | (KR) | ......................... 10-2022-0087561 |
| Mar. 29, 2023 | (KR) | ......................... 10-2023-0041282 |

(51) Int. Cl.
H01L 21/67 (2006.01)
H01L 21/687 (2006.01)

(52) U.S. Cl.
CPC .. H01L 21/67034 (2013.01); H01L 21/68785 (2013.01)

(58) Field of Classification Search
CPC ......................... D06F 39/022; H01L 21/67034
See application file for complete search history.

(56) References Cited

U.S. PATENT DOCUMENTS 7,404,407 B2 *  7/2008  Orii ................... H01L 21/67178
134/901

FOREIGN PATENT DOCUMENTS

| | | | | |
|---|---|---|---|---|
| JP | 2003318152 | | 11/2003 | |
| JP | 2007529106 A | * | 10/2007 | ............... B08B 1/34 |
| KR | 20080019110 | * | 3/2008 | |
| KR | 20080056855 A | | 6/2008 | |

OTHER PUBLICATIONS

Orii et al., KR20080019110, Mar. 2008 (Year: 2008).*

* cited by examiner

*Primary Examiner* — Jason Y Ko
(74) *Attorney, Agent, or Firm* — JCIPRNET

(57)     ABSTRACT

A substrate processing apparatus is disclosed. The substrate processing apparatus includes a chamber having a processing space in which substrate processing is performed therein, one or more exhaust lines connected to the chamber and configured to discharge a processing fluid from the processing space to an outside of the chamber, a supporting chuck disposed in the processing space, configured to support the substrate from below so that the substrate is disposed on an upper portion of the supporting chuck, and having an inner space configured to accommodate a first processing fluid, and one or more first supply lines configured to receive the first processing fluid from the outside of the chamber and transfer the first processing fluid to the inner space of the supporting chuck. In addition, various embodiments may be possible.

14 Claims, 10 Drawing Sheets

1

11c

11d

41

51

SUBSTRATE PROCESSING APPARATUS AND SYSTEM INCLUDING THE SAME

CROSS-REFERENCE TO RELATED APPLICATIONS

This application claims the benefit of Korean Patent Application No. 10-2022-0043954 filed on Apr. 8, 2022, Korean Patent Application No. 10-2022-0087561 filed on Jul. 15, 2022, and Korean Patent Application No. 10-2023-0041282 filed on Mar. 29, 2023, in the Korean Intellectual Property Office, the entire disclosures of which are incorporated herein by reference for all purposes.

BACKGROUND

1. Field of the Invention

One or more embodiments relate to a substrate processing apparatus and a system including the same.

2. Description of the Related Art

In general, semiconductors are manufactured by repeatedly performing a series of processes such as lithography, deposition, and etching. Contaminants such as various particles, metal impurities, or organic materials remain on a surface of a substrate constituting a semiconductor by repeated processes. Due to such contaminants remaining on the substrate, the reliability of the semiconductor may decrease. To remove the contaminants, a process of cleaning a substrate in a manufacturing process of a semiconductor is required.

Recently, a process of processing a substrate using a processing fluid has been adopted. In the substrate processing process using such a processing fluid, high pressure must be formed inside a processing space to satisfy a supercritical condition. Accordingly, a line, a valve, and the like for supplying a processing fluid into a chamber are required and a line, a valve, and the like for discharging the processing fluid from the chamber to the outside are required.

Due to the characteristics of a processing fluid, particles may be generated due to the flow velocity and flow rate in a process of supplying the processing fluid to a chamber. In addition, contaminants may remain in a line after the process is completed. Accordingly, a processing system that may mitigate particle generation and remove remaining contaminants is required.

For example, KR 10-2008-0056855 discloses "substrate processing apparatus and method".

The above description has been possessed or acquired by the inventor(s) in the course of conceiving the present disclosure and is not necessarily an art publicly known before the present application is filed.

SUMMARY

Embodiments provide a substrate processing apparatus in which a processing fluid is evenly sprayed into a chamber through a supporting chuck that may accommodate the processing fluid.

Embodiments provide a substrate processing apparatus that may increase the process efficiency by configuring various methods of supplying and spraying a processing fluid.

Embodiments provide a substrate processing method that may increase the process efficiency by configuring various stages of supplying a processing fluid.

According to an aspect, there is provided an apparatus for processing a substrate including a chamber having a processing space in which substrate processing is performed therein, one or more exhaust lines connected to the chamber and configured to discharge a processing fluid from the processing space to an outside of the chamber, a supporting chuck disposed in the processing space, configured to support the substrate from below so that the substrate is disposed on an upper portion of the supporting chuck, and having an inner space configured to accommodate a first processing fluid, and one or more first supply lines configured to receive the first processing fluid from the outside of the chamber and transfer the first processing fluid to the inner space of the supporting chuck.

The supporting chuck may include one or more discharge holes configured to spray the first processing fluid accommodated in the inner space of the supporting chuck to the processing space.

The discharge hole formed at the supporting chuck may be formed to be open in a direction opposite to a substrate supported from above of the supporting chuck.

The apparatus may further include one or more second supply lines configured to directly spray a second processing fluid from the outside of the chamber to the processing space.

Based on an inner wall of the chamber forming the processing space, the first supply line may extend from a first point of the chamber and the second supply line may extend from to a second point of the chamber, wherein the second point may be different from the first point.

The second supply line may extend from one of an upper surface and a lower surface of the processing space.

The first supply line may be provided in plurality. The plurality of first supply lines may be respectively connected to different points of the supporting chuck and configured to supply the first processing fluid to the inner space.

A pair of first supply lines may be connected to the supporting chuck. The pair of first supply lines for the supporting chuck may be respectively connected to opposite connecting points.

The discharge hole may be formed in plurality in a lower surface of the supporting chuck. The plurality of discharge holes may be disposed to form a circular shape based on a center of the lower surface of the supporting chuck.

The discharge hole may be formed in plurality in a lower surface of the supporting chuck. The plurality of discharge holes may be disposed to form a grid pattern.

The discharge hole may be formed in plurality in a lower surface of the supporting chuck. The plurality of discharge holes may be disposed to form a polygonal shape.

The discharge hole may be formed in plurality in a lower surface of the supporting chuck. The plurality of discharge holes may be disposed to form a straight-line shape.

The discharge hole located in an outer surface of the supporting chuck may have a diameter larger than a diameter of the discharge hole located in the inner space, based on a cross-section parallel to a spraying direction of the first processing fluid.

The apparatus may further include one or more second supply lines connected to the chamber and configured to directly spray a second processing fluid from an upper surface of the processing space to the substrate. A processing process of the substrate is performed through one of a first process configured to supply the second processing fluid to the processing space through the second supply line after supplying the first processing fluid transferred to the inner space through the first supply line to the processing space through the discharge hole, a second process configured to supply the first processing fluid transferred to the inner space through the first supply line to the processing space through the discharge hole after supplying the second processing fluid to the processing space through the second supply line, and a third process in which supplying the first processing fluid transferred to the inner space through the first supply line to the processing space through the discharge hole and supplying the second processing fluid to the processing space through the second supply line are simultaneously performed.

According to an aspect, there is provided a system for processing a substrate including a substrate processing apparatus configured to perform a processing process on the substrate, a transfer part configured to bring the substrate into the substrate processing apparatus to perform the processing process and bring the substrate out of the substrate processing apparatus when the processing process is completed. The substrate processing apparatus includes a chamber having a processing space in which substrate processing is performed therein, one or more exhaust lines connected to the chamber and configured to discharge a processing fluid from the processing space to an outside of the chamber, a supporting chuck disposed in the processing space, configured to support the substrate from below so that the substrate is disposed on an upper portion of the supporting chuck, and having an inner space configured to accommodate a first processing fluid, and one or more first supply lines configured to receive the first processing fluid from the outside of the chamber and transfer the first processing fluid to the inner space of the supporting chuck.

According to an aspect, there is provided an apparatus for processing a substrate including a chamber having a processing space in which substrate processing is performed therein, one or more exhaust lines connected to the chamber and configured to discharge a processing fluid from the processing space to an outside of the chamber, a supporting chuck disposed in the processing space, configured to support the substrate from below so that the substrate is disposed on an upper portion of the supporting chuck, and having an inner space configured to accommodate a first processing fluid, one or more first supply lines configured to receive the first processing fluid from the outside of the chamber and transfer the first processing fluid to the inner space of the supporting chuck, one or more second supply lines extending from an upper surface of the processing space and configured to directly spray a second processing fluid from the outside of the chamber to the processing space, and one or more third supply lines extending from a lower surface of the processing space and configured to directly spray a third processing fluid from the outside of the chamber to the processing space. The supporting chuck includes one or more discharge holes formed to be open in a direction opposite to the supported substrate and configured to spray the first processing fluid accommodated in the inner space to the processing space.

Additional aspects of embodiments will be set forth in part in the description which follows and, in part, will be apparent from the description, or may be learned by practice of the disclosure.

According to embodiments, a substrate processing apparatus may prevent a pattern collapse phenomenon on a surface of a substrate through the substrate processing apparatus that may evenly spray a processing fluid.

According to embodiments, a substrate processing apparatus may prevent damage to a substrate in a process of supplying a processing fluid.

According to embodiments, a substrate processing apparatus may evenly spray a processing fluid into a chamber through a supporting chuck that may accommodate the processing fluid.

According to embodiments, a substrate processing apparatus may increase the process efficiency by diversifying a method of supplying and spraying a processing fluid.

The effects of a substrate processing apparatus and a substrate processing method are not limited to the above-mentioned effects, and other unmentioned effects can be clearly understood from the above description by those of ordinary skill in the technical field to which the present disclosure pertains.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
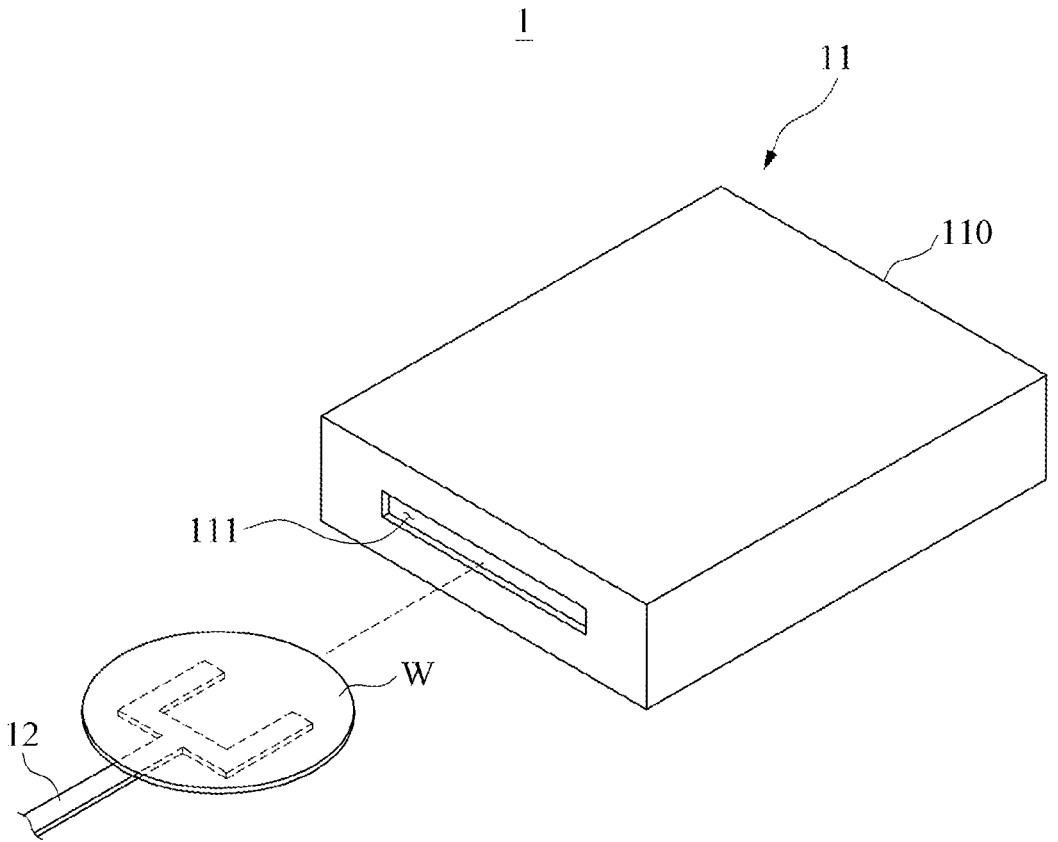
FIG. 1 is a schematic diagram illustrating a substrate processing system according to an embodiment.

This patent application claims priority based on Patent Application No. 2022-0043954, filed on Apr. 8, 2022, the disclosure of which is incorporated herein in its entirety by reference.

Hereinafter, examples will be described in detail with reference to the accompanying drawings. However, various alterations and modifications may be made to the examples. Here, the examples are not construed as limited to the disclosure. The examples should be understood to include all changes, equivalents, and replacements within the idea and the technical scope of the disclosure.

The terminology used herein is for the purpose of describing particular examples only and is not to be limiting of the examples. The singular forms "a," "an," and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which examples belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the embodiments with reference to the accompanying drawings, like reference numerals refer to like constituent elements and a repeated description related thereto will be omitted. In the description of embodiments, detailed description of well-known related structures or functions will be omitted when it is deemed that such description will cause ambiguous interpretation of the present disclosure.

Also, in the description of the components, terms such as first, second, A, B, (a), (b) or the like may be used herein when describing components of the present disclosure. These terms are used only for the purpose of discriminating one component from another component, and the nature, the sequences, or the orders of the components are not limited by the terms. It is to be understood that if a component is described as being "connected," "coupled" or "joined" to another component, the former may be directly "connected," "coupled," and "joined" to the latter or "connected", "coupled", and "joined" to the latter via another component.

The same name may be used to describe an element included in the examples described above and an element having a common function. Unless otherwise mentioned, the descriptions of the examples may be applicable to the following examples and thus, duplicated descriptions will be omitted for conciseness.

FIG. 1 is a schematic diagram illustrating a substrate processing system according to an embodiment.

Referring to FIG. 1, according to an embodiment, a substrate processing system 1 may be a system that performs a processing process on a substrate W. According to an embodiment, the substrate processing system 1 may be a system that processes the substrate W by forming high pressure in the inner space of a chamber 110. For example, the substrate processing system 1 may be a system that processes the substrate W with a processing fluid. The substrate processing process may include a process of cleaning the substrate W and/or a process of drying the substrate W. For example, the processing fluid may include a fluid in a pre-supercritical state (e.g., gas or liquid) and/or a fluid in a supercritical state.

According to an embodiment, the substrate processing system 1 may include a substrate processing apparatus 11 that performs a processing process on the substrate W and a transfer part 12 for bringing the substrate W into the substrate processing apparatus 11 to perform the substrate processing process on the substrate W and for bringing the substrate W out of the substrate processing apparatus 11 when the substrate processing process is completed.

According to an embodiment, the substrate processing system 1 may transfer the substrate W to the substrate processing apparatus 11 where the substrate processing process is performed. For example, the transfer part 12 may transfer the substrate W into the substrate processing apparatus 11 through an opening 111 formed in the chamber 110. According to an embodiment, the substrate processing system 1 may remove contaminants remaining on a surface of the substrate W by receiving a processing fluid and spraying the processing fluid to where the substrate W is accommodated.

FIGS. 2A to 2E are cross-sectional views illustrating a substrate processing apparatus according to various embodiments.

When describing a substrate processing apparatus with reference to FIGS. 2A to 2E, like reference numerals refer to like components and a repeated description related thereto is omitted.

Figure 2A:
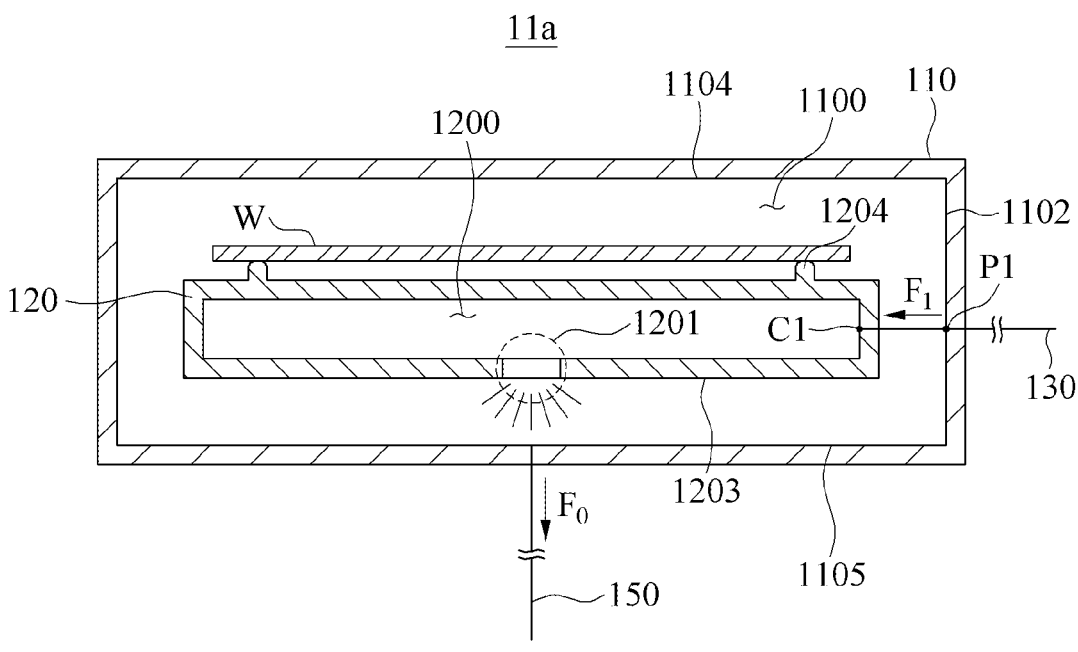
FIG. 2A is a cross-sectional view illustrating a substrate processing apparatus according to an embodiment.

Referring to FIG. 2A, according to an embodiment, a substrate processing apparatus 11a may spray a first processing fluid $F_1$ into the substrate processing apparatus 11a. In an embodiment, the first processing fluid $F_1$ may dry the substrate W and remove contaminants from the substrate W. According to an embodiment, the substrate processing apparatus 11a may accommodate the substrate W in a processing space 1100 formed inside the chamber 110 by receiving the substrate W from a transfer part (e.g., the transfer part 12 of FIG. 1). According to an embodiment, the substrate processing apparatus 11a may include the chamber 110, a supporting chuck 120, a first supply line 130, an exhaust line 150, and a discharge hole 1201.

According to an embodiment, the chamber 110 may provide the processing space 1100 in which processing of the substrate W is performed. According to an embodiment, the processing space 1100 may be formed inside the chamber 110 and the opening 111, through which the substrate W enters or exits, may be formed in the chamber 110. For example, the chamber 110 may include a housing having the opening 111, a door (not shown) closing the opening 111, and a sealing member (not shown) sealing the periphery of the opening 111.

According to an embodiment, the supporting chuck 120 may support the substrate W and accommodate the first processing fluid $F_1$. For example, the supporting chuck 120 may support the substrate W from below so that the substrate W is disposed on an upper portion of the supporting chuck 120. According to an embodiment, the supporting chuck 120 may be disposed in the processing space 1100 of the chamber 110. According to an embodiment, the supporting chuck 120 may include an inner space 1200, the discharge hole 1201, and a supporting member 1204.

According to an embodiment, the inner space 1200 of the supporting chuck 120 may be formed inside the supporting chuck 120. According to an embodiment, the inner space 1200 may accommodate the first processing fluid $F_1$. For example, the first processing fluid $F_1$ may be transferred from outside the chamber 110 of the substrate processing apparatus $11a$ to the inner space 1200 of the supporting chuck 120 through the first supply line 130 to be described below.

According to an embodiment, the discharge hole 1201 may spray the first processing fluid $F_1$ accommodated in the inner space 1200 of the supporting chuck 120 into the processing space 1100. According to an embodiment, the discharge hole 1201 may be formed to be open in a direction opposite to the substrate W supported on the supporting chuck 120.

According to an embodiment, the supporting member 1204 may support the substrate W by contact with the lower surface of the substrate W. According to an embodiment, the number of supporting members 1204 may be one or more.

According to an embodiment, the first supply line 130 may connect the chamber 110 and the supporting chuck 120 of the substrate processing apparatus $11a$. According to an embodiment, the first supply line 130 may transfer the first processing fluid $F_1$ from the outside the chamber 110 to the inner space 1200 of the supporting chuck 120.

According to an embodiment, the first supply line 130 may be connected to a first point P1 of the chamber 110 based on the inner wall of the chamber 110. For example, the first supply line 130 may be connected to a side surface 1102 of the processing space 1100 formed inside the chamber 110. For example, the first supply line 130 may pass through the first point P1 in the processing space 1100 and extend to be connected to a connecting point C1 of the supporting chuck 120. According to an embodiment, the first point P1 and the connecting point C1 may be at substantially the same height with respect to the ground.

According to an embodiment, the exhaust line 150 may be connected to the chamber 110. According to an embodiment, the exhaust line 150 may discharge a processing fluid from the processing space 1100 in the chamber 110 to the outside the chamber 110 (see $F_O$ in FIG. 2A).

According to a structure as shown in an embodiment, the first processing fluid $F_1$ may be evenly sprayed. Since the discharge hole 1201 is formed in a lower surface 1203 of the supporting chuck 120, damage to the substrate W may be prevented in a process of supplying the first processing fluid $F_1$ since the first processing fluid $F_1$ is not directly sprayed onto the substrate W.

Figure 2B:
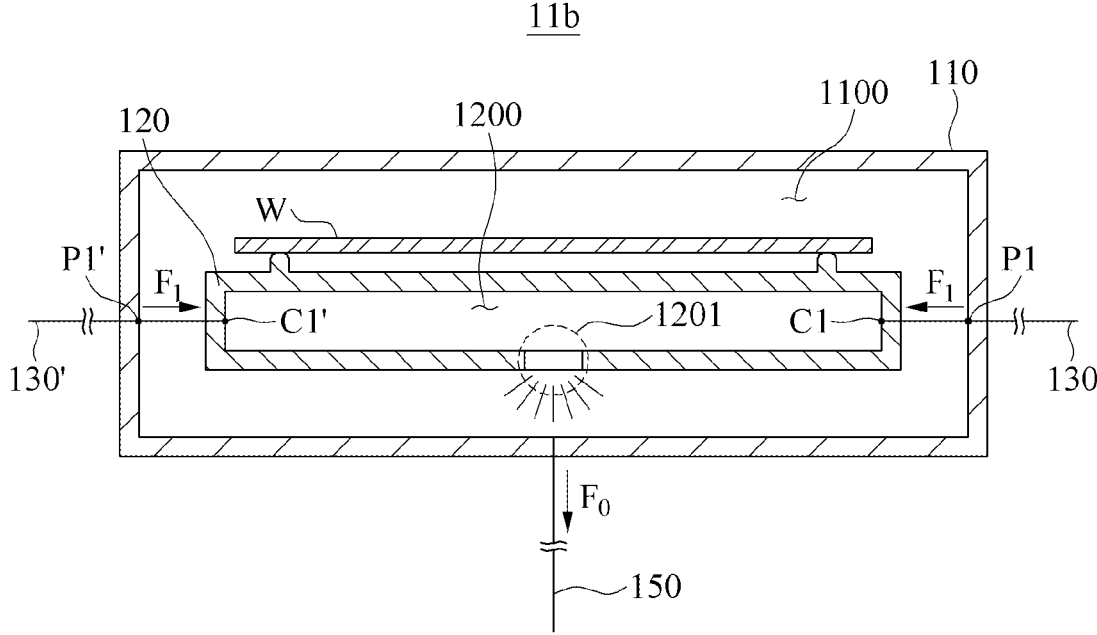
FIG. 2B is another cross-sectional view illustrating a substrate processing apparatus according to an embodiment.

Referring to FIG. 2B, according to an embodiment, a substrate processing apparatus $11b$ may include the chamber 110 (e.g., the chamber 110 in FIG. 2A), the supporting chuck 120 (e.g., the supporting chuck 120 in FIG. 2A), a plurality of first supply lines 130 and 130' (e.g., the first supply line 130 in FIG. 2A), and the exhaust line 150 (e.g., the exhaust line 150 in FIG. 2A). According to an embodiment, the substrate processing apparatus $11b$ may increase the efficiency of the substrate processing process by adjusting the supply amount of the first processing fluid $F_1$ by changing the number of supply lines.

According to an embodiment, the plurality of first supply lines 130 and 130' may be connected from different points P1 and P1' in the processing space 1100 of the chamber 110 to different points C1 and C1' of the supporting chuck 120, respectively, and may supply the first processing fluid $F_1$ to the inner space 1200 of the supporting chuck 120. For example, the different points C1 and C1' of the supporting chuck 120 may be opposite to each other with respect to the supporting chuck 120. The first processing fluid $F_1$ may be supplied simultaneously or individually to the plurality of first supply lines 130 and 130'. In an embodiment, the first processing fluid $F_1$ may be discharged to the outside of the chamber 110 through the exhaust line 150 connected to the chamber 110 (see $F_O$ in FIG. 2B).

Figure 2C:
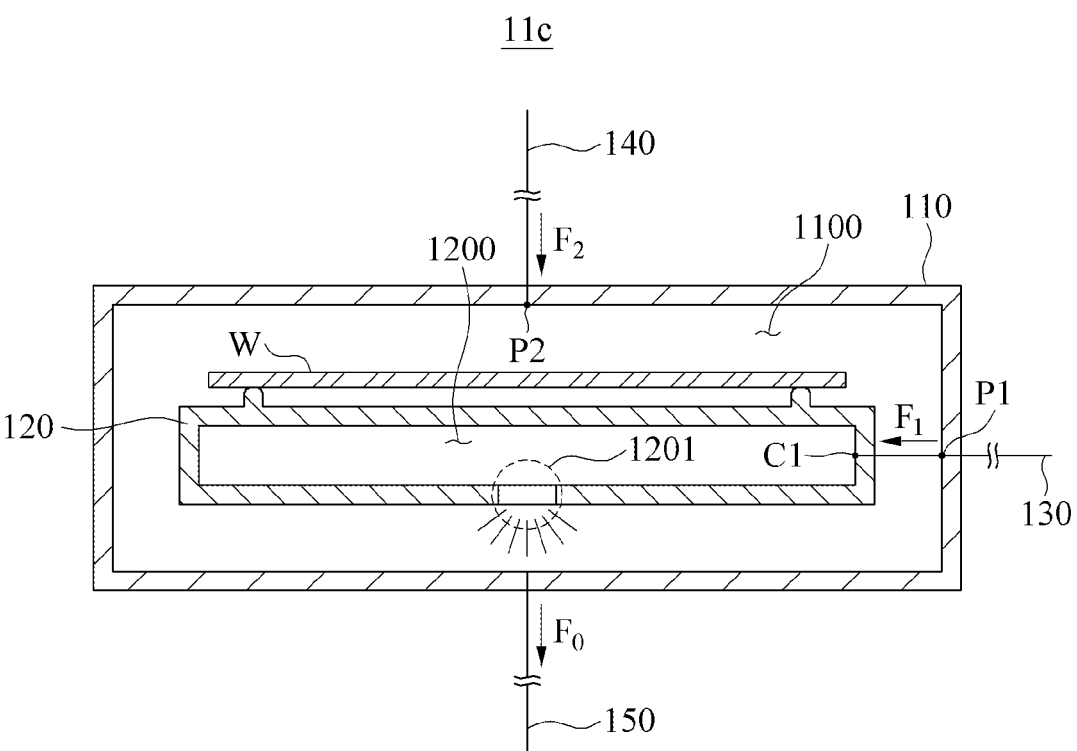
FIG. 2C is another cross-sectional view illustrating a substrate processing apparatus according to an embodiment.

Referring to FIG. 2C, according to an embodiment, a substrate processing apparatus $11c$ may include the chamber 110 (e.g., the chamber 110 in FIG. 2A), the supporting chuck 120 (e.g., the supporting chuck 120 in FIG. 2A), the first supply line 130 (e.g., the first supply line 130 in FIG. 2A), a second supply line 140, and the exhaust line 150 (e.g., the exhaust line 150 in FIG. 2A).

According to an embodiment, the second supply line 140 may be connected to the chamber 110. For example, the second supply line 140 may be connected to a second point P2 that is different from the first point P1 to which the first supply line 130 is connected, based on the inner wall of the chamber 110 forming the processing space 1100. For example, the second supply line 140 may be connected to one of the upper surface (e.g., an upper surface 1104 in FIG. 2A) of the processing space 1100 and the lower surface (e.g., a lower surface 1105 in FIG. 2A) of the processing space 1100. According to an embodiment, the number of second supply lines 140 may be one or more. The first processing fluid $F_1$ and a second processing fluid $F_2$ may be supplied simultaneously or individually to the first supply line 130 and the second supply line 140, respectively.

According to an embodiment, the second supply line 140 may directly spray the second processing fluid $F_2$ from the outside the chamber 110 into the processing space 1100. For example, the second supply line 140 may directly spray the second processing fluid $F_2$ from the upper portion of the processing space 1100 to the upper surface of the substrate W opposite to the supporting chuck 120. For example, the second supply line 140 may spray the second processing fluid $F_2$ toward the center of the substrate W. The second processing fluid $F_2$ may be the same as or different from the first processing fluid $F_1$.

According to an embodiment, the exhaust line 150 may discharge the first processing fluid $F_1$ supplied through the first supply line 130 and the second processing fluid $F_2$ supplied through the second supply line 140 to the outside the chamber 110 (see $F_O$ in FIG. 2C).

Figure 2D:
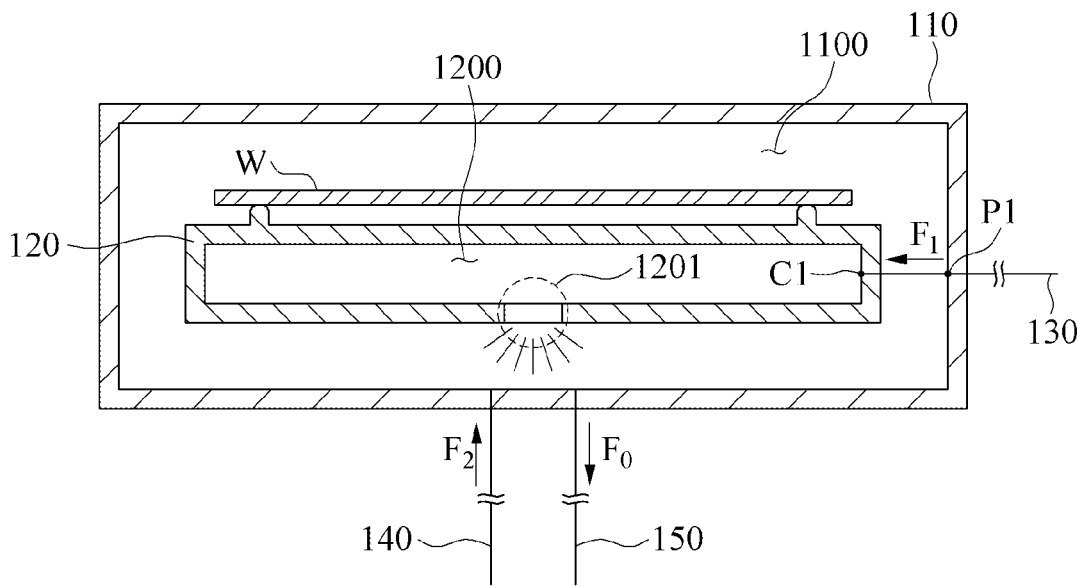
FIG. 2D is another cross-sectional view illustrating a substrate processing apparatus according to an embodiment.

Referring to FIG. 2D, according to an embodiment, a substrate processing apparatus $11d$ may include the chamber 110 (e.g., the chamber 110 in FIG. 2A), the supporting chuck 120 (e.g., the supporting chuck 120 in FIG. 2A), the first supply line 130 (e.g., the first supply line 130 in FIG. 2A), the second supply line 140 (e.g., the second supply line 140 in FIG. 2C), and the exhaust line 150 (e.g., the exhaust line 150 in FIG. 2A). According to an embodiment, the second supply line 140 may be connected to the lower surface (e.g., the lower surface 1105 in FIG. 2A) of the chamber 110.

Referring to FIGS. 2C and 2D, according to an embodiment, the substrate processing process may be a first process of supplying the second processing fluid $F_2$ to the processing space 1100 in the chamber 110 through the second supply line 140 after supplying the first processing fluid $F_1$ transferred to the inner space 1200 of the supporting chuck 120 through the first supply line 130 to the processing space 1100 in the chamber 110 through the discharge hole 1201.

According to an embodiment, the substrate processing process may be a second process of supplying the first processing fluid $F_1$ transferred to the inner space 1200 of the supporting chuck 120 through the first supply line 130 to the processing space 1100 in the chamber 110 through the discharge hole 1201 after supplying the second processing fluid $F_2$ to the processing space 1100 in the chamber 110 through the second supply line 140.

According to an embodiment, the substrate processing process may be a third process in which supplying the first processing fluid $F_1$ transferred to the inner space 1200 of the supporting chuck 120 through the first supply line 130 to the processing space 1100 in the chamber 110 through the discharge hole 1201 and supplying the second processing fluid $F_2$ to the processing space 1100 in the chamber 110 through the second supply line 140 are simultaneously performed.

According to an embodiment, a substrate processing apparatus (e.g., the substrate processing apparatus 11 in FIG. 1) may adjust the substrate processing efficiency by performing the substrate processing process according to one of the first process, the second process, and the third process.

Figure 2E:
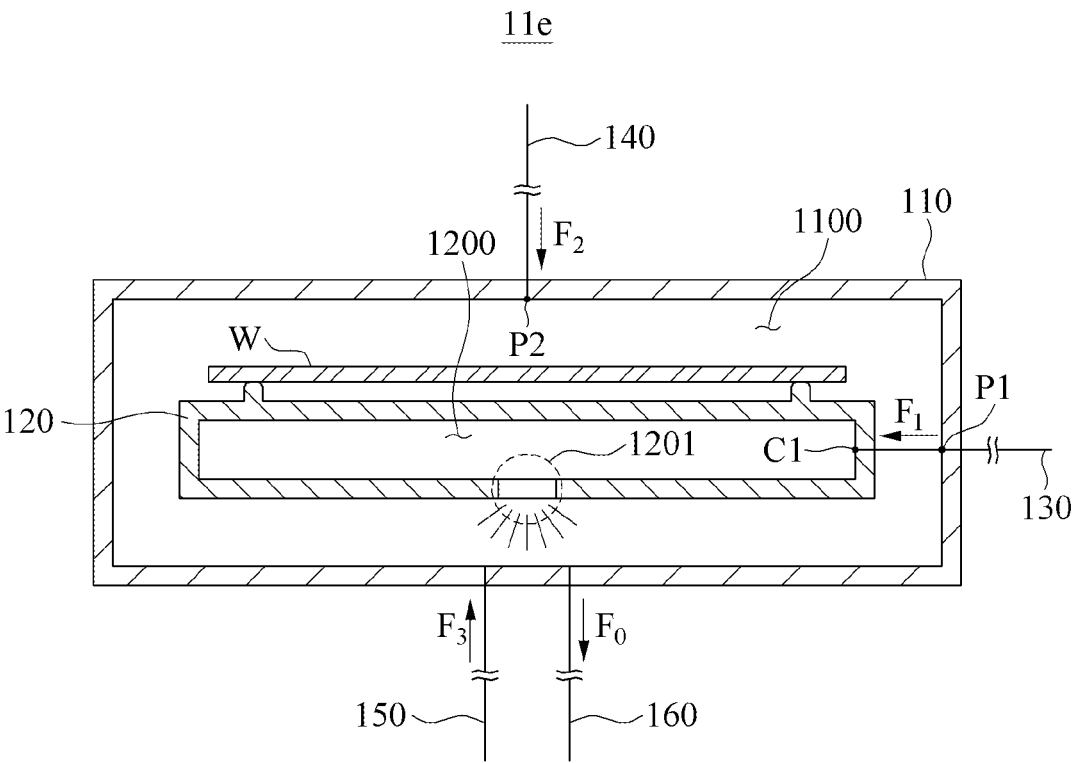
FIG. 2E is another cross-sectional view illustrating a substrate processing apparatus according to an embodiment.

Referring to FIG. 2E, according to an embodiment, a substrate processing apparatus 11e may include the chamber 110 (e.g., the chamber 110 in FIG. 2A), the supporting chuck 120 (e.g., the supporting chuck 120 in FIG. 2A), the first supply line 130 (e.g., the first supply line 130 in FIG. 2A), the second supply line 140 (e.g., the second supply line 140 in FIG. 2C), a third supply line 150, and an exhaust line 160 (e.g., the exhaust line 150 in FIG. 2A). According to an embodiment, the second supply line 140 may be connected to the upper surface (e.g., the upper surface 1104 in FIG. 2A) of the chamber 110. According to an embodiment, the third supply line 150 may be connected to the lower surface (e.g., the lower surface 1105 in FIG. 2A) of the chamber 110.

According to an embodiment, the substrate processing apparatus 11e may supply the first processing fluid $F_1$ to the inner space 1200 of the supporting chuck 120 through the first supply line 130. In an embodiment, the first processing fluid $F_1$ supplied to the inner space 1200 of the supporting chuck 120 may be supplied to the processing space 1100 in the chamber 110 through the discharge hole 1201 of the supporting chuck 120.

According to an embodiment, the substrate processing apparatus 11e may directly spray the second processing fluid $F_2$ into the processing space 1100 in the chamber 110 through the second supply line 140. According to an embodiment, since the second supply line 140 extends from the upper surface of the chamber 110, the second processing fluid $F_2$ may be directly sprayed toward the upper surface of the substrate W.

According to an embodiment, the substrate processing apparatus 11e may directly spray a third processing fluid $F_3$ into the processing space 1100 in the chamber 110 through the third supply line 150. According to an embodiment, since the third supply line 150 extends from the lower surface of the chamber 110, the third processing fluid $F_3$ may be directly sprayed toward the lower surface of the supporting chuck 120.

In an embodiment, the first processing fluid $F_1$, the second processing fluid $F_2$, and the third processing fluid $F_3$ supplied through the first supply line 130, the second supply line 140, and the third supply line 150, respectively, may be discharged to the outside of the chamber 110 through the exhaust line 160 connected to the chamber 110 (e.g., see $F_O$ in FIG. 2E). According to an embodiment, the first processing fluid $F_1$, the second processing fluid $F_2$, and the third processing fluid $F_3$ may all be different fluids or at least one of the first processing fluid $F_1$, the second processing fluid $F_2$, and the third processing fluid $F_3$ may be the same fluid.

Referring to FIG. 2E, according to an embodiment, the substrate processing process may be a first process of supplying the second processing fluid $F_2$ to the processing space 1100 in the chamber 110 through the second supply line 140 and supplying the third processing fluid $F_3$ to the processing space 1100 in the chamber 110 through the third supply line 150 after supplying the first processing fluid $F_1$ transferred to the inner space 1200 of the supporting chuck 120 through the first supply line 130 to the processing space 1100 in the chamber 110 through the discharge hole 1201.

According to an embodiment, the substrate processing process may be a second process of supplying the third processing fluid $F_3$ through the third supply line 150 and supplying the second processing fluid $F_2$ through the second supply line 140 after supplying the first processing fluid $F_1$ through the first supply line 130.

According to an embodiment, the substrate processing process may be a third process of supplying the first processing fluid $F_1$ through the first supply line 130 and supplying the third processing fluid $F_3$ through the third supply line 150 after supplying the second processing fluid $F_2$ through the second supply line 140.

According to an embodiment, the substrate processing process may be a fourth process of supplying the third processing fluid $F_3$ through the third supply line 150 and supplying the first processing fluid $F_1$ through the first supply line 130 after supplying the second processing fluid $F_2$ through the second supply line 140.

According to an embodiment, the substrate processing process may be a fifth process of supplying the first processing fluid $F_1$ through the first supply line 130 and supplying the second processing fluid $F_2$ through the second supply line 140 after supplying the third processing fluid $F_3$ through the third supply line 150.

According to an embodiment, the substrate processing process may be a sixth process of supplying the second processing fluid $F_2$ through the second supply line 140 and supplying the first processing fluid $F_1$ through the first supply line 130 after supplying the third processing fluid $F_3$ through the third supply line 150.

FIGS. 3A to 3G are schematic diagrams illustrating the lower surface of a supporting chuck according to various embodiments.

Figure 3A:
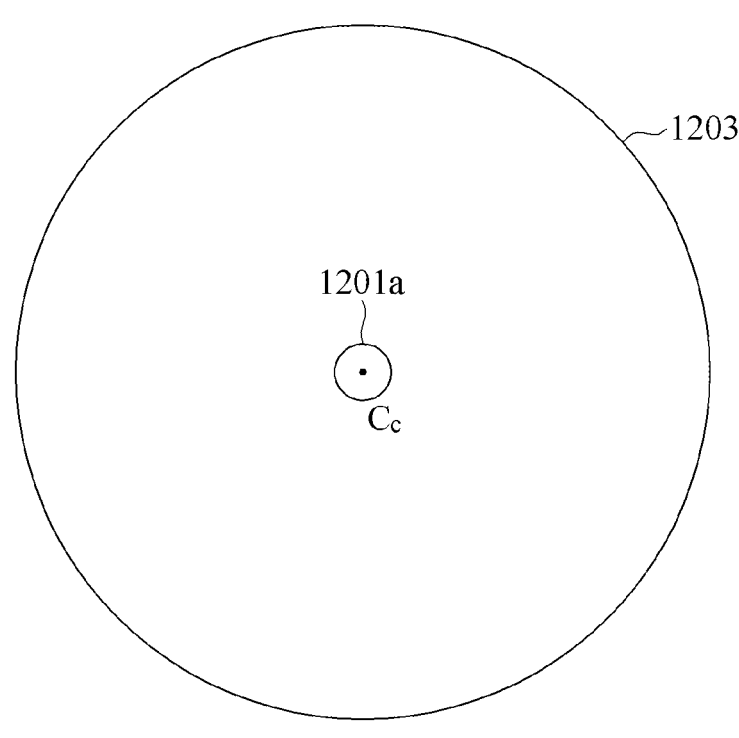
FIG. 3A is a schematic diagram illustrating the lower surface of a supporting chuck according to an embodiment.
Figure 3B:
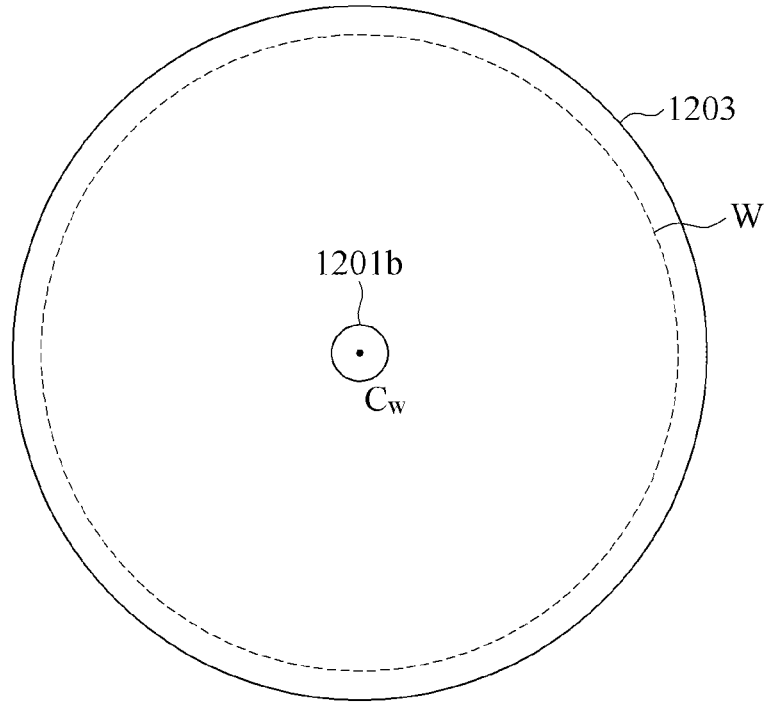
FIG. 3B is another schematic diagram illustrating the lower surface of a supporting chuck according to an embodiment.

Referring to FIG. 3A, for example, a discharge hole 1201a may be formed at a center $C_c$ of the lower surface (e.g., the lower surface 1203 in FIG. 2A) of a supporting chuck (e.g., the supporting chuck 120 in FIG. 2A). Referring to FIG. 3B, according to an embodiment, a discharge hole 1201b may be on substantially the same line as a center $C_w$ of the substrate W based on a direction perpendicular to a surface of the supported substrate W.

Figure 3C:
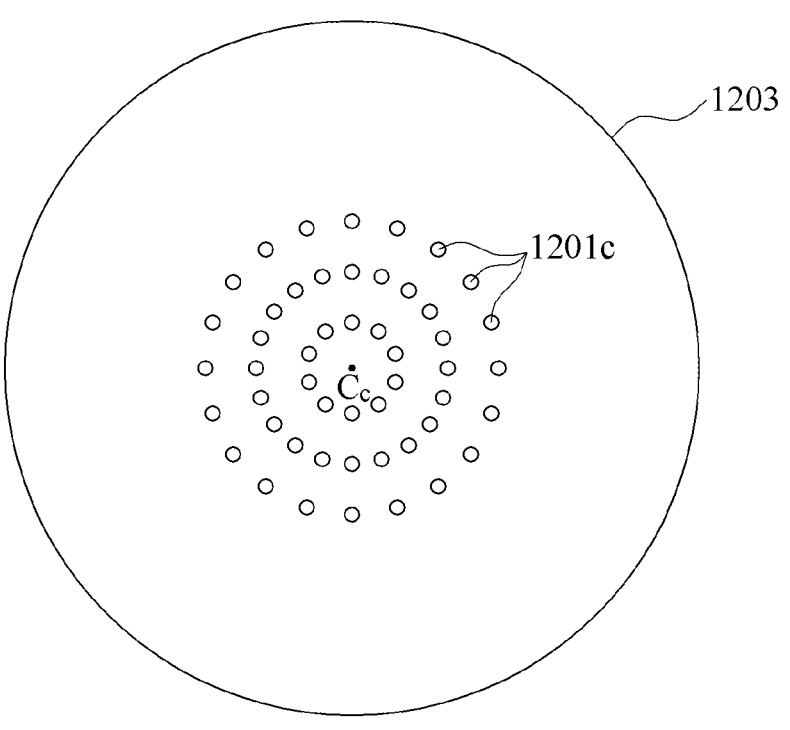
FIG. 3C is another schematic diagram illustrating the lower surface of a supporting chuck according to an embodiment.
Figure 3D:
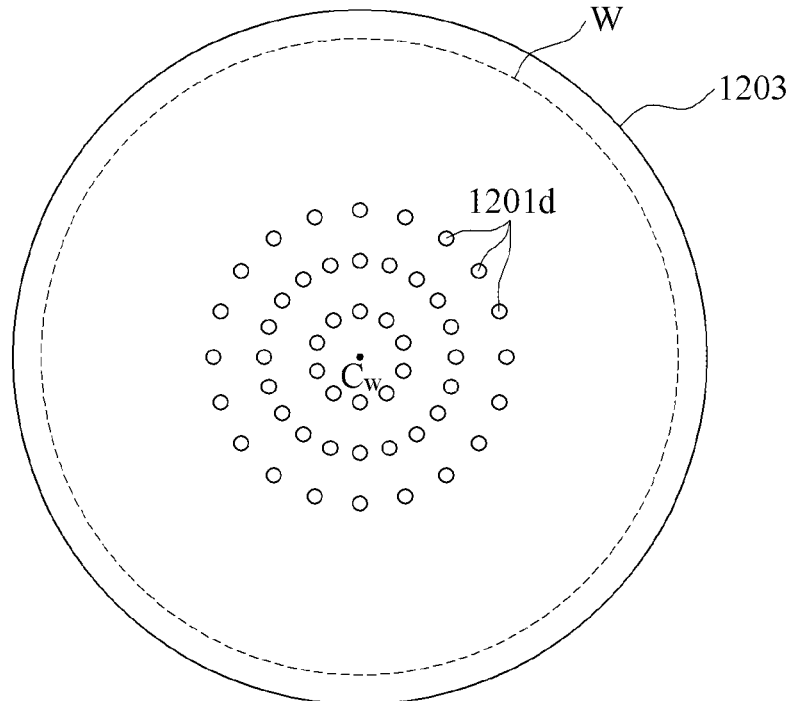
FIG. 3D is another schematic diagram illustrating the lower surface of a supporting chuck according to an embodiment.
Figure 3E:
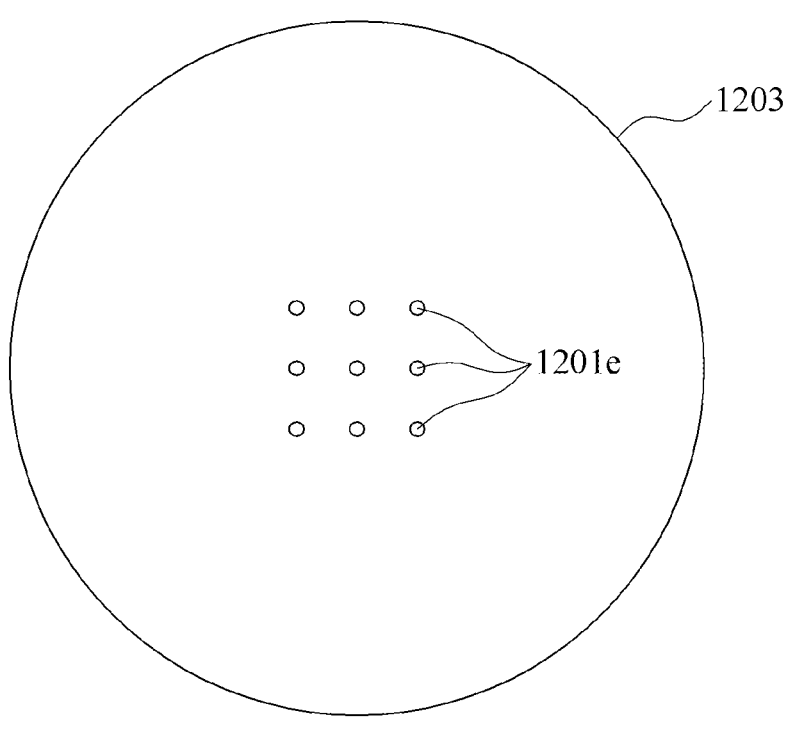
FIG. 3E is another schematic diagram illustrating the lower surface of a supporting chuck according to an embodiment.
Figure 3F:
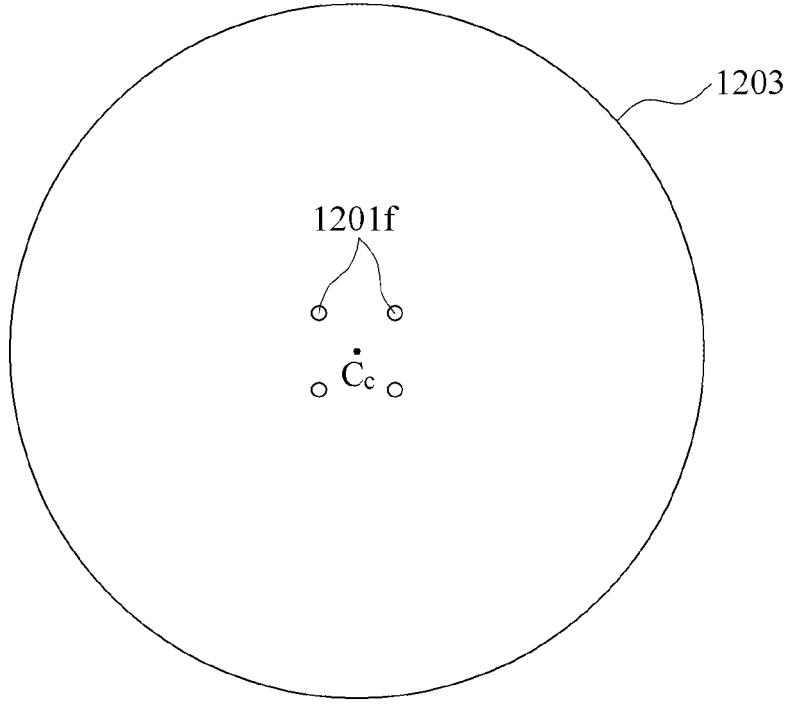
FIG. 3F is another schematic diagram illustrating the lower surface of a supporting chuck according to an embodiment.
Figure 3G:
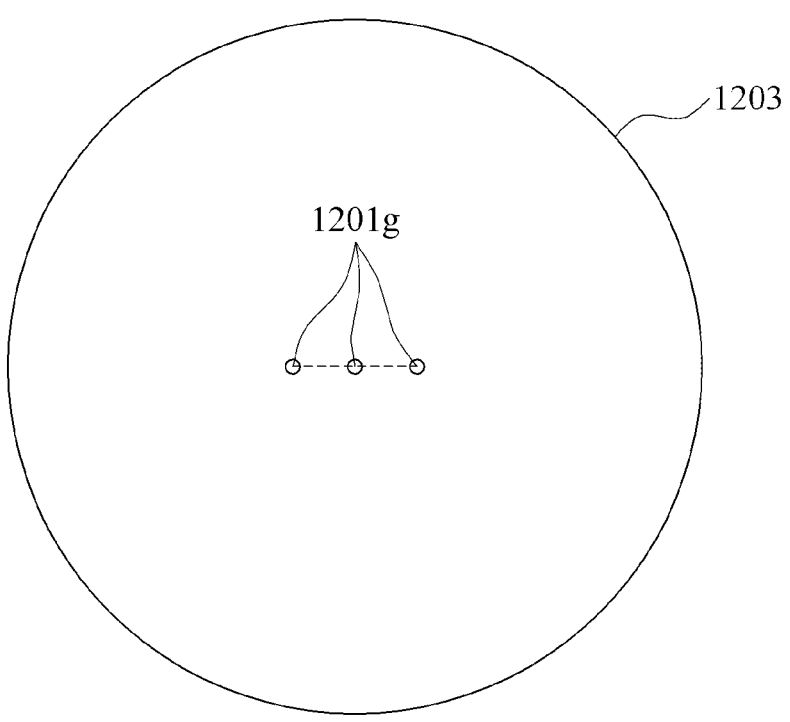
FIG. 3G is another schematic diagram illustrating the lower surface of a supporting chuck according to an embodiment.

Referring to FIGS. 3C to 3G, according to an embodiment, a discharge hole may be formed in plurality. For example, as shown in FIG. 3C, a plurality of discharge holes 1201c may be disposed to form a circular shape based on the center $C_c$ of the lower surface of the supporting chuck 120. For example, as shown in FIG. 3D, a plurality of discharge holes 1201d may be disposed to form a circular shape around an axis passing through the center $C_w$ of the substrate W. For example, as shown in FIG. 3E, a plurality of discharge holes 1201e may be disposed to form a lattice pattern on the lower surface 1203 of the supporting chuck 120. For example, as shown in FIG. 3F, a plurality of discharge holes 1201f may be disposed to form a polygonal shape on the lower surface 1203 of the supporting chuck 120. For example, as shown in FIG. 3G, a plurality of discharge holes 1201g may be disposed to form a substantially straight-line shape on the lower surface 1203 of the supporting chuck 120.

Figure 4:
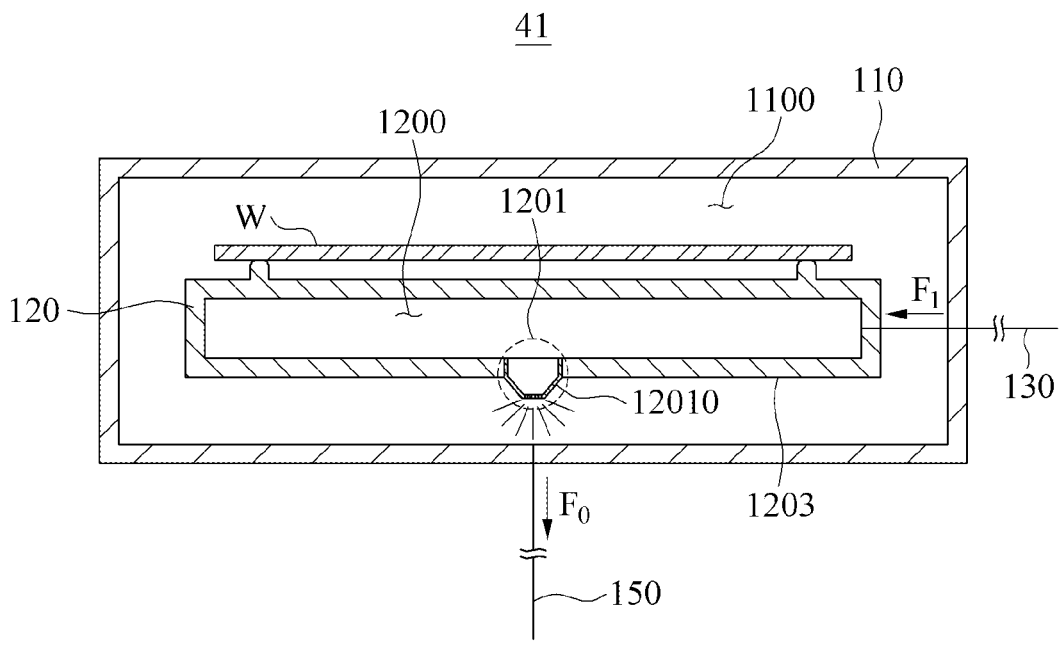
FIG. 4 is a cross-sectional view illustrating a substrate processing apparatus according to an embodiment.

FIG. 4 is a cross-sectional view illustrating a substrate processing apparatus according to an embodiment.

Referring to FIG. 4, according to an embodiment, a substrate processing apparatus 41 may include the chamber 110 (e.g., the chamber 110 in FIG. 2A), the supporting chuck 120 (e.g., the supporting chuck 120 in FIG. 2A), the first supply line 130 (e.g., the first supply line 130 in FIG. 2A), and the exhaust line 150 (e.g., the exhaust line 150 in FIG. 2A). According to an embodiment, the supporting chuck 120 may include the discharge hole 1201 to discharge the first processing fluid $F_1$ supplied from the first supply line 130 to the processing space 1100 in the chamber 110.

According to an embodiment, a nozzle 12010 may be connected to the discharge hole 1201. In an embodiment, the nozzle 12010 may distribute and discharge a processing fluid in a process of spraying the processing fluid of the inner space (e.g., the inner space 1200 in FIG. 2A) of the supporting chuck 120 into a processing space (e.g., the processing space 1100 in FIG. 2A). For example, the processing fluid sprayed through the nozzle 12010 may be sprayed in a range wider than the diameter of the nozzle 12010.

Figure 5:
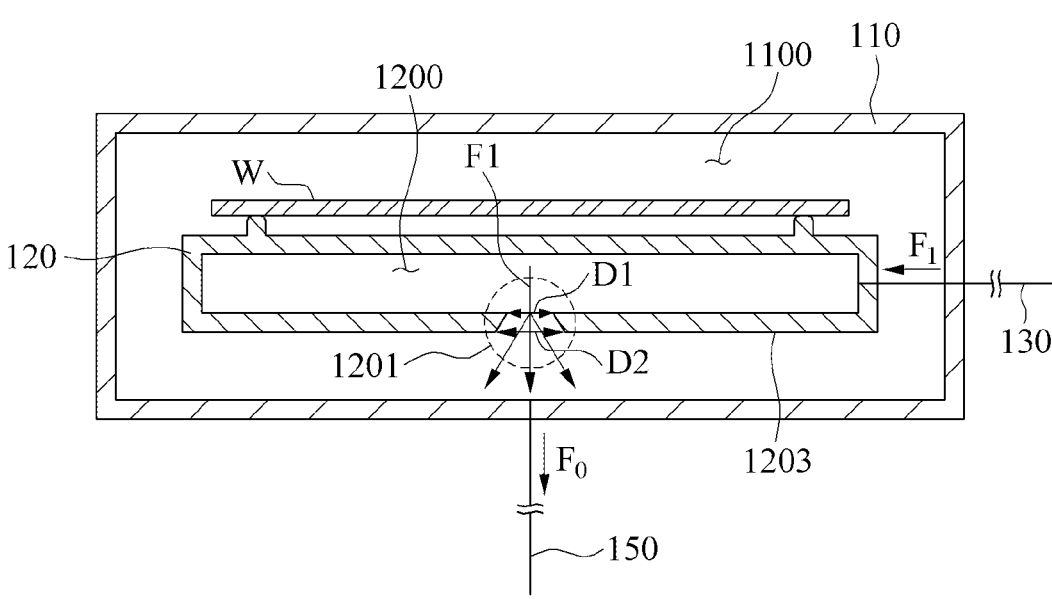
FIG. 5 is another cross-sectional view illustrating a substrate processing apparatus according to an embodiment.

FIG. 5 is another cross-sectional view illustrating a substrate processing apparatus according to an embodiment.

Referring to FIG. 5, according to an embodiment, a substrate processing apparatus 51 may include the chamber 110 (e.g., the chamber 110 in FIG. 2A), the supporting chuck 120 (e.g., the supporting chuck 120 in FIG. 2A), the first supply line 130 (e.g., the first supply line 130 in FIG. 2A), and the exhaust line 150 (e.g., the exhaust line 150 in FIG. 2A). According to an embodiment, the supporting chuck 120 may include the discharge hole 1201 to discharge the first processing fluid $F_1$ supplied from the first supply line 130 to the processing space 1100 in the chamber 110.

In an embodiment, based on a cross-section parallel to a spraying direction of the first processing fluid $F_1$, a diameter D2 of the discharge hole 1201 located in the outer surface of the supporting chuck 120 may be greater than a diameter D1 of the discharge hole 1201 located in the inner space 1200. Accordingly, since a flow passage of the first processing fluid $F_1$ from the discharge hole 1201 to the processing space 1100 is widened along a flow path, the first processing fluid $F_1$ may be evenly sprayed into the processing space 1100 in the chamber 110. However, this is only an example, and the diameter D2 of the discharge hole 1201 located in the outer surface of the supporting chuck 120 may be less than the diameter D1 of the discharge hole 1201 located in the inner space 1200.

Hereinafter, a method of processing a substrate, according to an embodiment, is described. When describing a method of processing a substrate, a repeated description related to the above descriptions is omitted. In addition, unless otherwise specified, the same terms as the above terms may be understood as meaning the same configuration.

Figure 6:
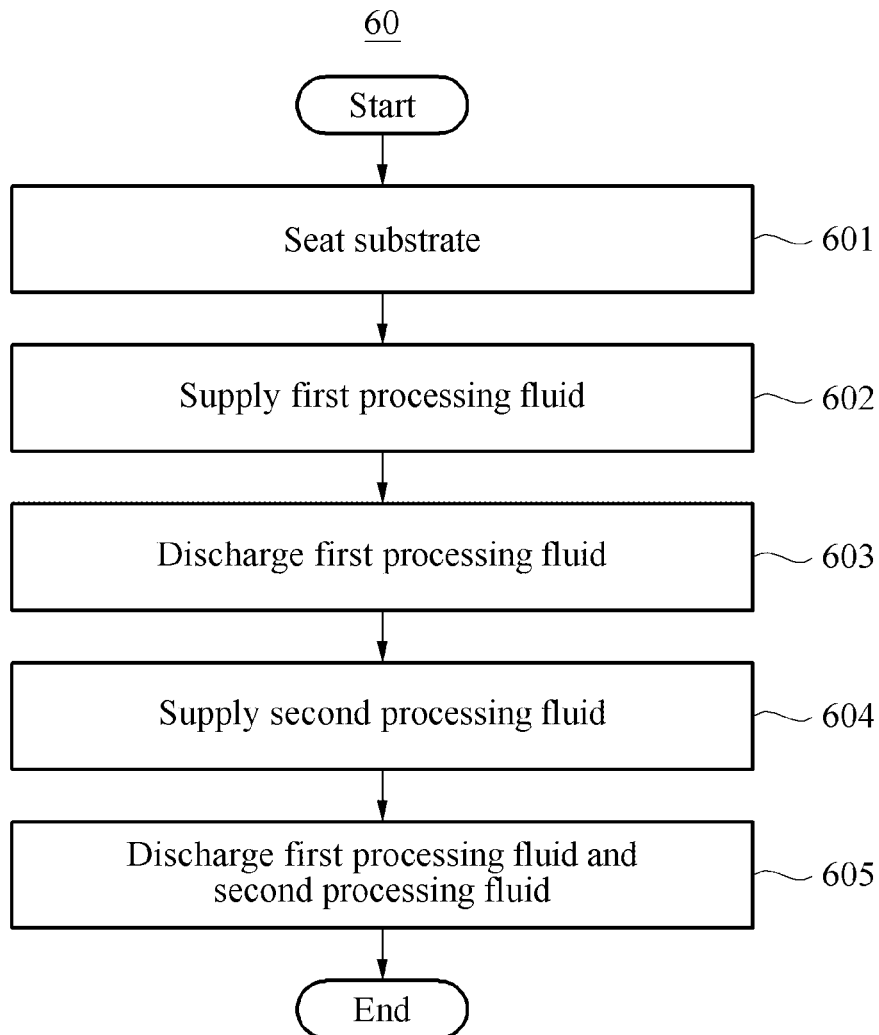
FIG. 6 is a flowchart illustrating a substrate processing method according to an embodiment.

FIG. 6 is a flowchart illustrating a substrate processing method according to an embodiment.

Referring to FIG. 6, in an embodiment, a substrate processing method 60 may be used to clean and/or dry a substrate (e.g., the substrate W in FIG. 2A) using a processing fluid. In an embodiment, the substrate processing method 60 may be performed by a substrate processing apparatus (e.g., the substrate processing apparatus 11*a* in FIG. 2A).

According to an embodiment, the substrate processing method 60 may include, by bringing a substrate to be processed into a processing space, operation 601 of seating the substrate on the upper portion of a supporting chuck, operation 602 of supplying a first processing fluid to the inner space formed in the supporting chuck through a first supply line, operation 603 of discharging the first processing fluid supplied to the inner space through a discharge hole formed in the lower surface of the supporting chuck to the processing space, operation 604 of supplying a second processing fluid to the processing space through a second supply line, and operation 605 of discharging the first processing fluid and the second processing fluid from the processing space through an exhaust line.

In operation 601, the substrate may be brought into the processing space in the substrate processing apparatus through an opening formed in a chamber by a transfer part. The substrate to be processed brought into the processing space may be seated on the upper portion of the supporting chuck. The substrate to be processed may be in contact with the supporting chuck through a supporting member formed on the supporting chuck.

In operation 602, the first processing fluid may be supplied to the inner space in the supporting chuck through the first supply line passing through outside the chamber and the inner space formed in the supporting chuck. According to an embodiment, a point at which the first supply line is connected to the chamber and a point at which the first supply line is connected to the inner space in the supporting chuck may be at substantially the same height with respect to the ground. In an embodiment, one or more first supply lines may be provided and the plurality of first supply lines may be respectively connected to opposite connecting points with respect to the supporting chuck.

In operation 603, the first processing fluid supplied from the outside of the chamber to the inner space in the supporting chuck through the first supply line may be discharged to the processing space in the chamber through the discharge hole formed in the lower surface of the supporting chuck. In an embodiment, the discharge hole may be formed on the same line as the center of the lower surface of the supporting chuck or the center of the supported substrate. In an embodiment, the discharge hole may be disposed to form a circular shape around an axis passing through the center of the lower surface of the supporting chuck or the center of the substrate. In an embodiment, the discharge hole may be disposed to form a grid pattern, polygonal shape, or substantially straight-line shape. In an embodiment, a nozzle may be connected to the discharge hole and evenly spray the first processing fluid.

In operation 604, the second processing fluid may be supplied to the processing space in the chamber through the second supply line passing through the processing space formed the outside of the chamber and inside of the chamber. According to an embodiment, one or more second supply lines may be provided and may be connected to one of the upper surface and the lower surface of the processing space.

In operation 605, the first processing fluid and the second processing fluid supplied to the processing space in the chamber may be discharged to the outside of the chamber through the exhaust line.

In an embodiment, operation 604 may be performed after operation 602 or before operation 602. In an embodiment, operation 604 and operation 602 may be simultaneously performed.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. For example, suitable results may be achieved if the described techniques are performed in a different order, and/or if components in a described system, architecture, device, or circuit are combined in a different manner, or replaced or supplemented by other components or their equivalents.

Therefore, other implementations, other embodiments, and/or equivalents of the claims are within the scope of the following claims.

What is claimed is:

1. An apparatus for processing a substrate, the apparatus comprising:

a chamber having a processing space in which substrate processing is performed therein;

one or more exhaust lines connected to the chamber and configured to discharge a processing fluid from the processing space to an outside of the chamber;

a supporting chuck disposed in the processing space, configured to support the substrate from below so that the substrate is disposed on an upper portion of the supporting chuck, and having an inner space configured to accommodate a first processing fluid; and one or more first supply lines configured to receive the first processing fluid from the outside of the chamber and transfer the first processing fluid to the inner space of the supporting chuck, wherein the supporting chuck comprises one or more discharge holes formed in a lower surface of the supporting chuck and configured to discharge the first processing fluid accommodated in the inner space of the supporting chuck downwardly to the processing space.

2. The apparatus of claim 1, further comprising:

one or more second supply lines configured to directly spray a second processing fluid from the outside of the chamber to the processing space.

3. The apparatus of claim 2, wherein, based on an inner wall of the chamber forming the processing space, the first supply line extends from a first point of the chamber; and the second supply line extends from a second point of the chamber, wherein the second point is different from the first point.

4. The apparatus of claim 3, wherein the second supply line extends from one of an upper surface and a lower surface of the processing space.

5. The apparatus of claim 1, wherein the first supply line is provided in plurality, wherein the plurality of first supply lines is respectively connected to different points of the supporting chuck and configured to supply the first processing fluid to the inner space.

6. The apparatus of claim 5, wherein a pair of first supply lines is connected to the supporting chuck, wherein the pair of first supply lines for the supporting chuck is respectively connected to opposite connecting points.

7. The apparatus of claim 1, wherein the discharge hole is formed in plurality, wherein the plurality of discharge holes is disposed to form a circular shape based on a center of the lower surface of the supporting chuck.

8. The apparatus of claim 1, wherein the discharge hole is formed in plurality, wherein the plurality of discharge holes is disposed to form a grid pattern.

9. The apparatus of claim 1, wherein the discharge hole is formed in plurality, wherein the plurality of discharge holes is disposed to form a polygonal shape.

10. The apparatus of claim 1, wherein the discharge hole is formed in plurality, wherein the plurality of discharge holes is disposed to form a straight-line shape.

11. The apparatus of claim 1, wherein the discharge hole located in an outer surface of the supporting chuck has a diameter larger than a diameter of the discharge hole located in the inner space, based on a cross-section parallel to a spraying discharging direction of the first processing fluid.

12. The apparatus of claim 1, further comprising:

one or more second supply lines connected to the chamber and configured to directly spray a second processing fluid from an upper surface of the processing space to the substrate, wherein a processing process of the substrate is performed through one of:

a first process configured to supply the second processing fluid to the processing space through the second supply line after supplying the first processing fluid transferred to the inner space through the first supply line to the processing space through the discharge hole;

a second process configured to supply the first processing fluid transferred to the inner space through the first supply line to the processing space through the discharge hole after supplying the second processing fluid to the processing space through the second supply line; and a third process in which supplying the first processing fluid transferred to the inner space through the first supply line to the processing space through the discharge hole and supplying the second processing fluid to the processing space through the second supply line are simultaneously performed.

13. A system for processing a substrate, the system comprising:

a substrate processing apparatus; and a transfer part configured to bring the substrate into the substrate processing apparatus to perform the processing process and bring the substrate out of the substrate processing apparatus when the processing process is completed, wherein the substrate processing apparatus comprises:

a chamber having a processing space in which substrate processing is performed therein;

one or more exhaust lines connected to the chamber and configured to discharge a processing fluid from the processing space to an outside of the chamber;

a supporting chuck disposed in the processing space, configured to support the substrate from below so that the substrate is disposed on an upper portion of the supporting chuck, and having an inner space configured to accommodate a first processing fluid; and one or more first supply lines configured to receive the first processing fluid from the outside of the chamber and transfer the first processing fluid to the inner space of the supporting chuck, wherein the supporting chuck comprises one or more discharge holes formed in a lower surface of the supporting chuck and configured to discharge the first processing fluid accommodated in the inner space of the supporting chuck downwardly to the processing space.

14. An apparatus for processing a substrate, the apparatus comprising:

a chamber having a processing space in which substrate processing is performed therein;

one or more exhaust lines connected to the chamber and configured to discharge a processing fluid from the processing space to an outside of the chamber;

a supporting chuck disposed in the processing space, configured to support the substrate from below so that the substrate is disposed on an upper portion of the supporting chuck, and having an inner space configured to accommodate a first processing fluid;

one or more first supply lines configured to receive the first processing fluid from the outside of the chamber and transfer the first processing fluid to the inner space of the supporting chuck;

one or more second supply lines extending from an upper surface of the processing space and configured to directly spray a second processing fluid from the outside of the chamber to the processing space; and one or more third supply lines extending from a lower surface of the processing space and configured to directly spray a third processing fluid from the outside of the chamber to the processing space, wherein the supporting chuck comprises one or more discharge holes formed to be open in a direction opposite to the supported substrate and configured to spray the first processing fluid accommodated in the inner space to the processing space.

* * * * *